(12) United States Patent
Mo et al.

(10) Patent No.: US 8,971,825 B2
(45) Date of Patent: *Mar. 3, 2015

(54) FRACTIONAL-N SYNTHESIZER

(71) Applicant: Aviacomm Inc., Sunnyvale, CA (US)

(72) Inventors: Shih Hsiung Mo, San Jose, CA (US); Yan Cui, Plano, TX (US); Chung-Hsing Chang, Milpitas, CA (US)

(73) Assignee: Aviacomm Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/304,761

(22) Filed: Jun. 13, 2014

(65) Prior Publication Data

US 2014/0292376 A1    Oct. 2, 2014

Related U.S. Application Data

(63) Continuation of application No. 13/300,440, filed on Nov. 18, 2011, now Pat. No. 8,768,268.

(51) Int. Cl.
*H04B 1/40* (2006.01)
*H03K 5/00* (2006.01)
*H03B 19/00* (2006.01)

(52) U.S. Cl.
CPC ............ *H03K 5/00006* (2013.01); *H03B 19/00* (2013.01); *H03B 2200/0048* (2013.01); *H03B 2200/0072* (2013.01)
USPC .............................. 455/76; 455/313; 455/323

(58) Field of Classification Search
CPC .. H03K 5/0006; H03B 19/00; H03B 2200/48; H03B 2200/72
USPC .................. 455/76, 313, 318, 323; 331/18, 19
See application file for complete search history.

(56) References Cited

U.S. PATENT DOCUMENTS

| | | | | |
|---|---|---|---|---|
| 3,818,376 | A * | 6/1974 | Keller et al. | 331/116 M |
| 6,380,774 | B2 * | 4/2002 | Saeki | 327/119 |
| 6,779,010 | B2 * | 8/2004 | Humphreys et al. | 708/490 |
| 6,859,109 | B1 * | 2/2005 | Leung et al. | 331/46 |
| 7,231,196 | B2 * | 6/2007 | Chien et al. | 455/260 |
| 7,288,998 | B2 * | 10/2007 | Thomsen et al. | 331/16 |
| 7,295,077 | B2 * | 11/2007 | Thomsen et al. | 331/10 |
| 7,486,145 | B2 * | 2/2009 | Floyd et al. | 331/1 A |
| 7,764,134 | B2 * | 7/2010 | Fu et al. | 331/74 |
| 7,969,251 | B2 * | 6/2011 | Fu et al. | 331/74 |
| 2005/0063238 | A1 * | 3/2005 | Nambu et al. | 365/222 |
| 2006/0119437 | A1 * | 6/2006 | Thomsen et al. | 331/10 |
| 2006/0214706 | A1 * | 9/2006 | Temple | 327/117 |
| 2007/0293163 | A1 * | 12/2007 | Kilpatrick et al. | 455/84 |
| 2008/0007365 | A1 * | 1/2008 | Venuti et al. | 331/179 |
| 2008/0164917 | A1 * | 7/2008 | Floyd et al. | 327/117 |
| 2008/0225989 | A1 * | 9/2008 | An et al. | 375/326 |
| 2008/0233892 | A1 * | 9/2008 | Marholev et al. | 455/77 |
| 2009/0098833 | A1 * | 4/2009 | Tokairin et al. | 455/76 |
| 2009/0184773 | A1 * | 7/2009 | Woo et al. | 331/1 R |
| 2009/0201066 | A1 * | 8/2009 | Do et al. | 327/299 |

* cited by examiner

*Primary Examiner* — Lewis West
(74) *Attorney, Agent, or Firm* — Shun Yao; Park, Vaughan, Fleming & Dowler LLP

(57) ABSTRACT

One embodiment of the present invention provides a synthesizer. The synthesizer includes one or more tunable oscillators, a frequency-dividing circuit coupled to the tunable oscillators, and a multiplexer coupled to the frequency-dividing circuit. The frequency-dividing circuit includes a number of frequency dividers, and is configured to generate a number of frequency-dividing outputs. At least one frequency-dividing output has a different frequency division factor. The multiplexer is configured to select a frequency-dividing output.

8 Claims, 3 Drawing Sheets

FRACTIONAL-N SYNTHESIZER

RELATED APPLICATION

This application is a continuation of U.S. application Ser. No. 13/300,440, entitled "FRACTIONAL-N SYNTHESIZER," by inventors Shih Hsiung Mo, Yan Cui, and Chung-Hsing Chang, filed 18 Nov. 2011.

BACKGROUND

1. Field

The present disclosure relates generally to a synthesizer used in wireless communication systems. More specifically, the present disclosure relates to a wide-frequency-range synthesizer used for wide-band transceivers.

2. Related Art

Traditional wireless communication systems are usually designed for a specific standard, such as GSM (Global System for Mobile Communications) or Wideband Code Division Multiple Access (W-CDMA), each requiring different carrier frequencies. For example, the carrier frequency of the GSM signals varies from 800 MHz to 1 GHz, while the carrier frequency of the W-CDMA varies between 2-3 GHz. Current demand for convergence of wireless services, in which users can access different standards from the same wireless device, is driving the development of multi-standard and multi-band transceivers, which are capable of transmitting/receiving radio signals in the entire wireless communication spectrum (from 300 MHz to 3 GHz).

SUMMARY

One embodiment of the present invention provides a synthesizer. The synthesizer includes one or more tunable oscillators, a frequency-dividing circuit coupled to the tunable oscillators, and a multiplexer coupled to the frequency-dividing circuit. The frequency-dividing circuit includes a number of frequency dividers, and is configured to generate a number of frequency-dividing outputs. At least one frequency-dividing output has a different frequency division factor. The multiplexer is configured to select a frequency-dividing output.

In a variation on this embodiment, the tunable oscillators are voltage-controlled oscillators (VCOs).

In a further variation, at least one of the VCOs includes a complementary metal-oxide semiconductor (CMOS) capacitor.

In a further variation, the oscillators, the frequency-dividing circuit, and the multiplexer are integrated onto a single application-specific integrated circuit (ASIC) chip.

In a variation on this embodiment, the frequency dividers have a same division factor.

In a further variation, the division factor is 2.

In a further variation, frequency-division factors of the frequency-dividing outputs are powers of 2.

In a variation on this embodiment, outputs of adjacent frequency-dividing circuit branches overlap, thus facilitating continuous tuning of the synthesizer's output.

In a variation on this embodiment, a frequency tuning range of the synthesizer's output is between 300 MHz and 3 GHz.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide a solution for a tunable synthesizer with an ultra-wide tuning range. In one embodiment, the tuning range of the tunable synthesizer covers the entire wireless communication spectrum. The tunable synthesizer includes one or two tunable synthesizer sources and multiple frequency-dividing circuit branches, each providing a tunable output at a different frequency band.

Tunable Synthesizers for Wireless RF Front-End

To meet the multi-standard and multi-band requirements, the RF front-end (which includes circuitry between the antenna and the first intermediate frequency (IF) stage) needs to operate over multiple frequency bands. In other words, the transmitter or receiver front-end needs to work with radio signals that have a frequency range from 300 MHz up to 3 GHz. A tunable synthesizer with an ultra-wide tuning range is needed to achieve such a wide-band transmitter or receiver.

Figure 1:
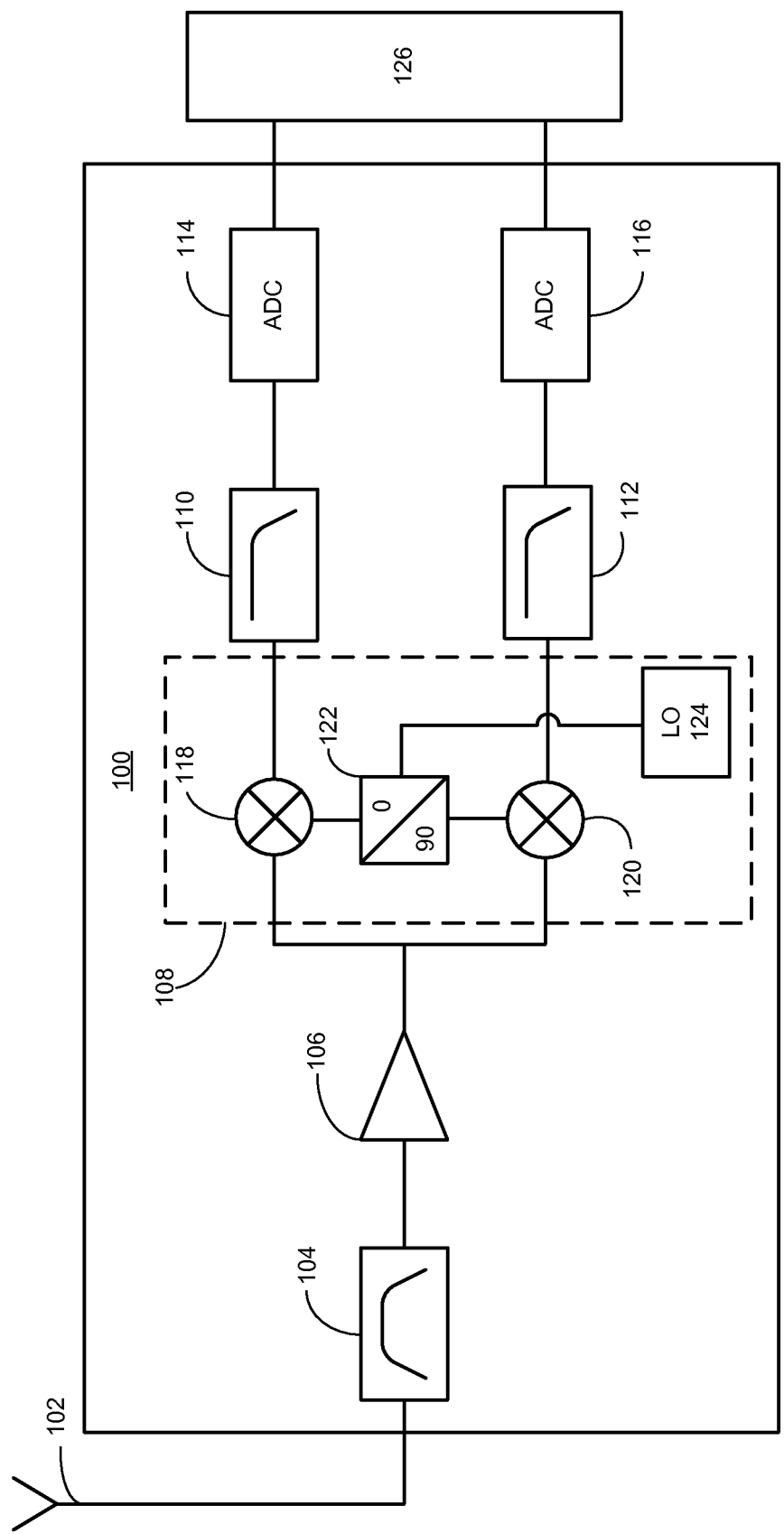
FIG. 1 presents a diagram illustrating the architecture of a direct-conversion receiver.

FIG. 1 presents a diagram illustrating the architecture of a direct-conversion receiver. Direct-conversion receiver 100 includes a band pass filter (BPF) 104, an amplifier 106, an IQ (in-phase quadrature) demodulator 108, low-pass filters (LPFs) 110 and 112, and analog-to-digital converters (ADCs) 114 and 116. IQ demodulator 108 includes mixers 118 and 120, 90°/0° phase shifter 122, and local oscillator (LO)/synthesizer 124.

During operation, incoming RF signals received via an antenna 102 are filtered and amplified by BPF 104 and amplifier 106, respectively. Subsequently, the RF signal is directly down-converted to in-phase (I) and quadrature (Q) baseband signals by IQ demodulator 108. Note that, in order to perform the down-conversion (or to generate the sum and difference frequencies at the baseband I/Q output ports), LO/synthesizer 124 needs to provide I and Q mixers 118 and 120 with a sinusoidal wave at a frequency that is the same as the carrier frequency of the wanted signal. LPFs 110 and 112 can heavily reject the summation frequency and allow only signals at the difference frequency (the baseband signals) to pass. ADCs 114 and 116 convert I and Q signals to the digital domain before sending them to a baseband processor 126 for further processing.

To receive wireless signals that range from 300 Mhz to 3 GHz, the LO/synthesizer 124 needs to be able to generate sinusoidal waves at the same range. In other words, a tunable synthesizer with an ultra-wide frequency tuning range is needed. However, conventional tunable synthesizers usually have limited tuning range. For example, a voltage-controlled oscillator (VCO) achieves frequency tuning by varying voltages applied to a voltage-controlled capacitor, such as a complementary metal-oxide semiconductor (CMOS) capacitor in accumulation. The capacitance of the CMOS capacitor in accumulation varies when different gate voltages are applied. The tuning ratio of a typical CMOS varicap is around 2 to 3, resulting in the frequency-tuning ratio of the VCO being less than 2. Synthesizers with such a limited tuning range cannot meet the requirement of the ultra-wide band transceiver.

Embodiments of the present invention provide a tunable synthesizer design that achieves a large frequency-tuning ratio using various stages of cascaded frequency dividers. In one embodiment, a frequency-tuning ratio of 16 is achieved, making it possible to have a tunable synthesizer that has a tuning range covering the entire wireless communication spectrum.

Figure 2:
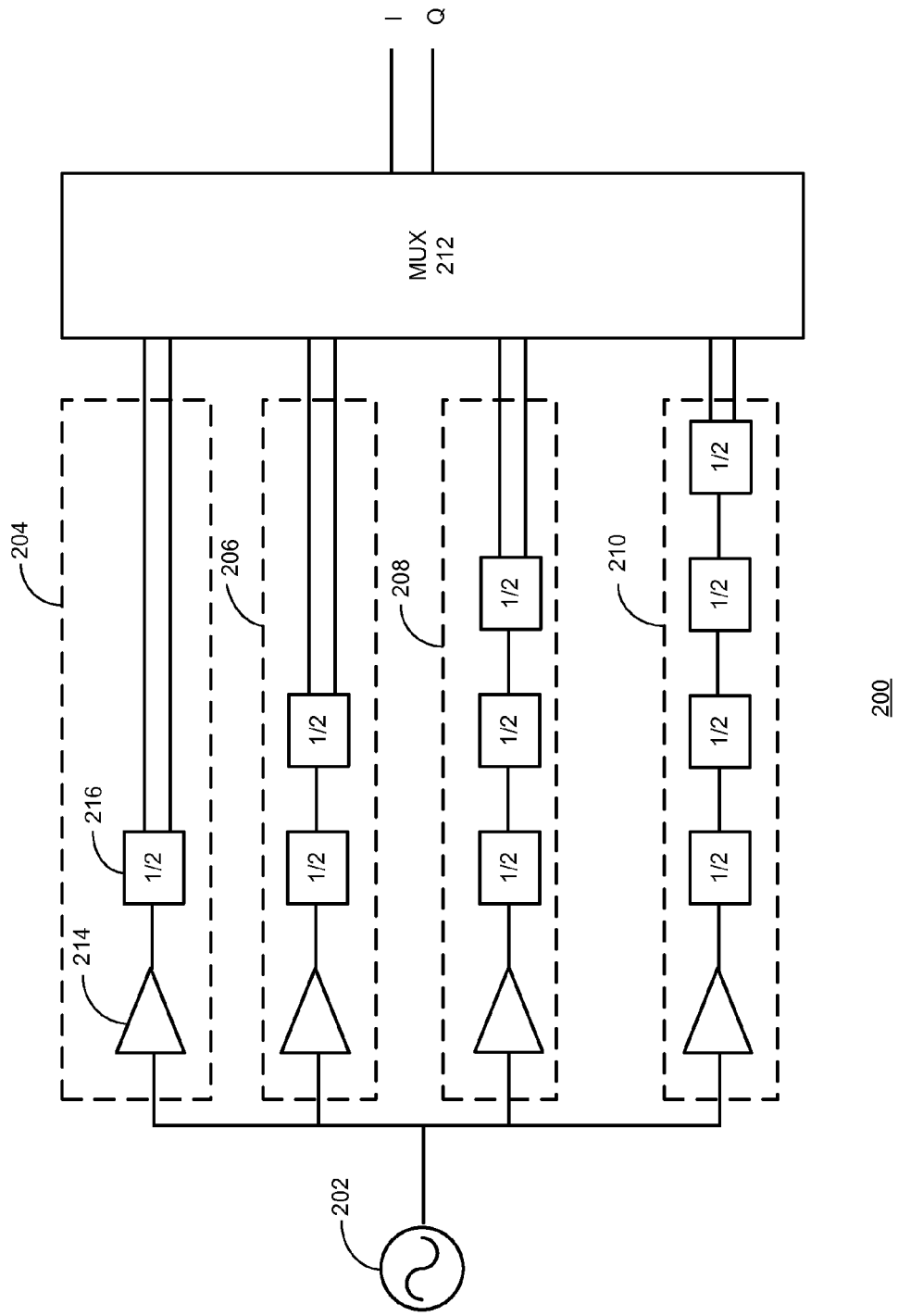
FIG. 2 presents a schematic of a tunable synthesizer with an ultra-wide tuning range, in accordance with an embodiment of the present invention.

FIG. 2 presents a schematic of a tunable synthesizer with an ultra-wide tuning range, in accordance with an embodiment of the present invention. A widely tunable synthesizer 200 includes a high-frequency tunable oscillator 202, a number of frequency-dividing circuit branches (branches 204, 206, 208, and 210), and a 4×1 multiplexer (MUX) 212. High-frequency tunable oscillator 202 provides a reference frequency for those frequency-dividing circuit branches. In one embodiment, high-frequency tunable oscillator 202 is implemented using a CMOS capacitor in accumulation. In a further embodiment, tunable oscillator 202 and the rest of the circuit for widely tunable synthesizer 200 (including the frequency-dividing branches and MUX 212) are integrated on a single chip, such as an application-specific integrated circuit (ASIC) chip. Each frequency-dividing circuit branch includes an amplifier and a number of cascaded divide-by-2 (or ½) frequency dividers. Note that the amplifiers provide buffering/isolation between tunable oscillator 202 and the rest of the circuits.

The division factor of the frequency-dividing circuit branch is determined by the number of cascaded stages of the ½ frequency dividers. For example, frequency-dividing circuit branch 204 includes an amplifier 214 and a ½ frequency divider 216, providing a division factor of 2; and frequency-dividing circuit branch 206 includes an amplifier and two cascaded ½ frequency dividers, providing a division factor of 4. Similarly, frequency-dividing circuit branches 208 and 210 include 3 and 4 cascaded ½ frequency dividers, respectively, providing division factors of 8 and 16. The outputs of the frequency-dividing circuit branches (each branch has two outputs, the I and Q outputs) are sent to 4×1 MUX 212, which selects the outputs from one of the frequency-dividing circuit branches based on the desired frequency band. Hence, MUX 212 can provide a sinusoidal wave at a frequency that is ½, ¼, ⅛, or 1/16 of the output frequency of high-frequency tunable oscillator 202.

In one embodiment, high-frequency tunable oscillator 202 has a tuning range from 3 GHz to 6 GHz. Consequently, the output frequency of frequency-dividing circuit branch 204 ranges from 1.5 GHz to 3 GHz. Similarly, the frequency ranges of the outputs of frequency-dividing circuit branches 206, 208, and 210 are 750 MHz-1.5 GHz, 375 MHz-750 GHz, and 187.5 MHz-375 MHz, respectively. Hence, the output of synthesizer 200 has a tunable range from 187.5 MHz to 3 GHz, covering the entire wireless communication spectrum.

It may be challenging to obtain a high-quality CMOS-based tunable oscillator with tuning range from 3 GHz to 6 GHz. To ease such a requirement, in one embodiment two tunable oscillators, instead of one, are used to provide the reference frequency.

Figure 3:
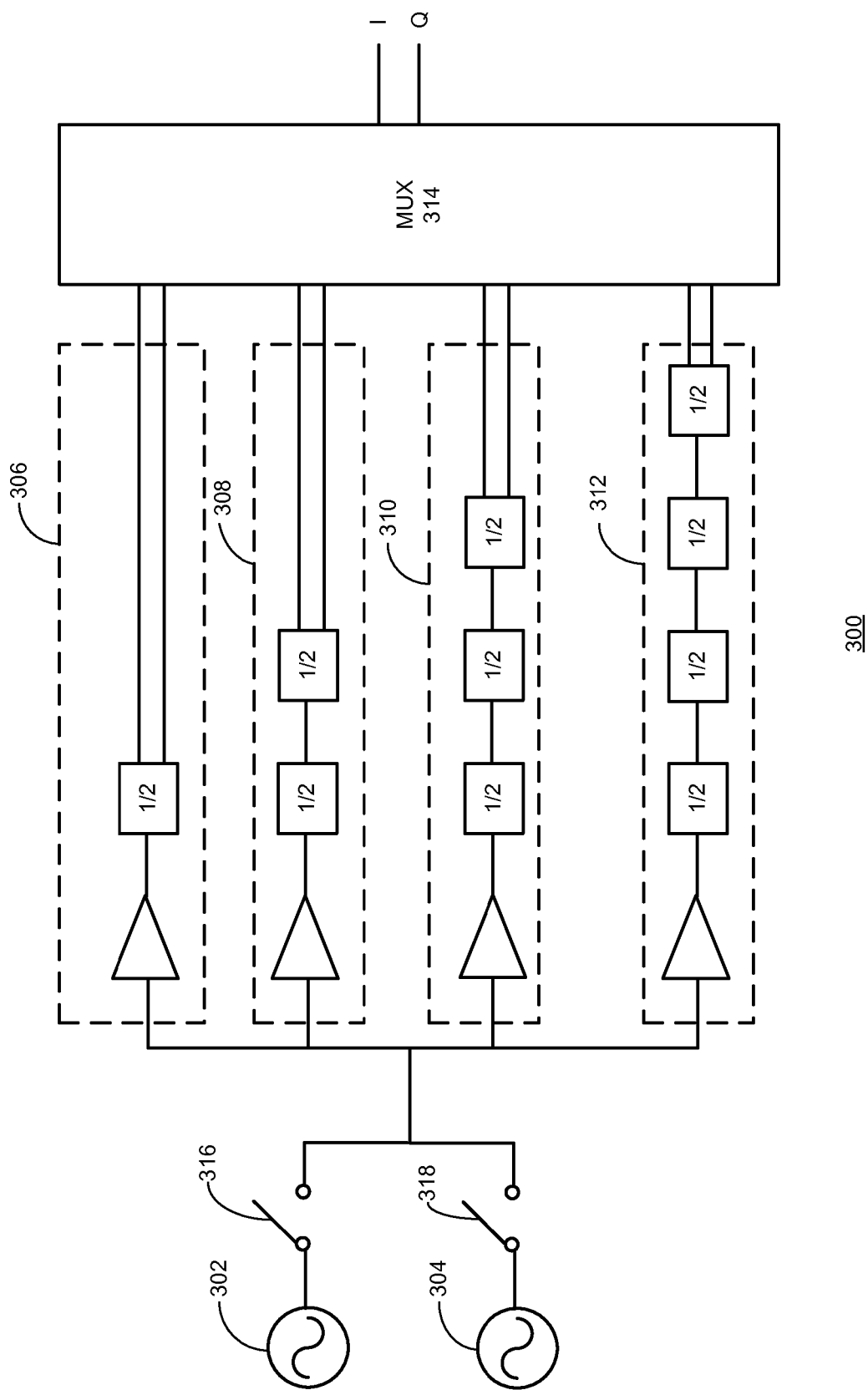
FIG. 3 presents a schematic of a tunable synthesizer with an ultra-wide tuning range, in accordance with an embodiment of the present invention.

FIG. 3 presents a schematic of a tunable synthesizer with an ultra-wide tuning range, in accordance with an embodiment of the present invention. Similar to FIG. 2, FIG. 3 shows a widely tunable synthesizer 300 that includes a number of frequency-dividing circuit branches (branches 306, 308, 310, and 312), and a 4×1 multiplexer (MUX) 314. Different from tunable synthesizer 200 shown in FIG. 2, tunable synthesizer 300 includes two high-frequency tunable oscillators, oscillators 302 and 304, which are coupled to the frequency-dividing circuit branches via switches 316 and 318, respectively. Tunable oscillators 302 and 304 provide reference frequencies for the frequency-dividing circuit branches.

As discussed before, these frequency-dividing circuit branches can provide frequency division factors in powers of 2 (such as 2, 4, 8, and 16). To continuously cover the entire wireless transmission spectrum (up to 3 GHz), the reference frequency needs to be tunable between 3 GHz and 6 GHz. This tunable range is covered collectively by tunable oscillators 302 and 304. In one embodiment, tunable oscillator 302 has a tuning range between 3 GHz and 4 GHz, and tunable oscillator 304 has a tuning range between 4 GHz and 6 GHz. As one can see, although the number of tunable oscillators increases in FIG. 3, the tuning ratio requirements for each tunable oscillator are relaxed.

Note that, to ensure continuous tuning, it is also possible for these two oscillators to have overlapping tuning ranges. For example, the tuning range for tunable oscillators 302 and 304 can be from 3 to 4.5 GHz and from 4 to 6.5 GHz, respectively.

The examples shown in FIGS. 2 and 3 are for illustration purposes only and should not limit the scope of this disclosure. In general, embodiments of the present invention provide a fractional-N synthesizer based on cascaded frequency dividers and CMOS-based tunable oscillators. The frequency range of this synthesizer covers the entire wireless communication spectrum. The circuit configurations shown in FIGS. 2 and 3 are merely exemplary. Other configurations are also possible. For example, the number of tunable oscillators can be more than 2, and the number of frequency-dividing branches can be more than 4. In one embodiment, instead of having separate frequency-dividing branches as shown in FIGS. 2 and 3, a single frequency-dividing branch with multiple cascade stages of frequency dividers can be used, and the output of each stage can be selected to achieve the different frequency bands. In a further embodiment, frequency dividers of division factors other than 2, such as 3 or 4, can be used.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:
1. A synthesizer, comprising:
one or more tunable oscillators;
a frequency-dividing circuit coupled to the tunable oscillators, wherein the frequency-dividing circuit includes a number of frequency dividers, wherein the frequency-dividing circuit is configured to generate a plurality of frequency-dividing outputs, wherein at least two frequency-dividing outputs have different frequency division factors; and
a multiplexer coupled to the frequency-dividing circuit, wherein the multiplexer is configured to select a frequency-dividing output, wherein the frequency-dividing outputs of the frequency-dividing circuit have frequencies ranging from 187.5 MHz all the way up to 3 GHz.

2. The synthesizer of claim 1, wherein the tunable oscillators are voltage-controlled oscillators (VCOs).

3. The synthesizer of claim 2, wherein at least one of the VCOs includes a complementary metal-oxide semiconductor (CMOS) capacitor.

4. The synthesizer of claim 3, wherein the oscillators, the frequency-dividing circuit, and the multiplexer are integrated onto a single application-specific integrated circuit (ASIC) chip.

5. The synthesizer of claim 1, wherein the frequency dividers have a same division factor.

6. The synthesizer of claim 5, wherein the division factor is 2.

7. The synthesizer of claim 6, wherein frequency-division factors of the frequency-dividing outputs are powers of 2.

8. The synthesizer of claim 1, wherein outputs of adjacent frequency-dividing circuit branches overlap, thus facilitating continuous tuning of the synthesizer's output.

* * * * *